US011200922B2

(12) United States Patent
Thyagarajan et al.

(10) Patent No.: US 11,200,922 B2
(45) Date of Patent: Dec. 14, 2021

(54) MEMORY MULTIPLEXING TECHNIQUES

(71) Applicant: Arm Limited, Cambridge (GB)

(72) Inventors: Sriram Thyagarajan, Austin, TX (US); Andy Wangkun Chen, Austin, TX (US); Yew Keong Chong, Austin, TX (US); Munish Kumar, Noida (IN)

(73) Assignee: Arm Limited, Cambridge (GB)

( * ) Notice: Subject to any disclaimer, the term of this patent is extended or adjusted under 35 U.S.C. 154(b) by 37 days.

(21) Appl. No.: 16/725,779

(22) Filed: Dec. 23, 2019

(65) Prior Publication Data

US 2021/0193195 A1 Jun. 24, 2021

(51) Int. Cl.
*G11C 7/10* (2006.01)
*G11C 7/22* (2006.01)

(52) U.S. Cl.
CPC .......... *G11C 7/1012* (2013.01); *G11C 7/1051* (2013.01)

(58) Field of Classification Search
CPC ......... G11C 11/419; G11C 7/065; G11C 7/06; G11C 7/12; G11C 11/418; G11C 7/22; G11C 8/18; G11C 16/26
See application file for complete search history.

(56) References Cited

U.S. PATENT DOCUMENTS

| | | | | |
|---|---|---|---|---|
| 5,642,324 A * | 6/1997 | Ghosh | ...................... | G11C 7/22 365/189.07 |
| 6,075,744 A * | 6/2000 | Tsern | ...................... | G11C 8/08 365/222 |
| 6,462,988 B1 * | 10/2002 | Harari | ................. | G11C 11/5621 365/185.22 |
| 2008/0037333 A1 * | 2/2008 | Kim | ...................... | G11C 7/1069 365/189.02 |
| 2014/0304462 A1 * | 10/2014 | Venugopal | ............... | G11C 8/12 711/104 |
| 2018/0033495 A1 * | 2/2018 | Ghosh | ................... | G11C 29/781 |
| 2019/0267049 A1 * | 8/2019 | Asthana | ................. | G11C 11/419 |

* cited by examiner

*Primary Examiner* — Hien N Nguyen
(74) *Attorney, Agent, or Firm* — Pramudji Law Group PLLC; Ari Pramudji

(57) ABSTRACT

Various implementations described herein are related to a device having memory circuitry and multiplexer circuitry. The memory circuitry may include a single bank of memory cells that are arranged in multiple columns, and each column of the multiple columns may provide singe-bit data. The multiplexer circuitry may include multiplexer logic that receives the single-bit data from each column of the multiple columns and provides selected data as output data.

20 Claims, 11 Drawing Sheets

MEMORY MULTIPLEXING TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern industrial applications, some circuit layout designs incorporate use of infrastructure cores. Due to extensive use of many processing cores in infrastructure applications, redundancy may be a necessary option in some memories for improved yield. Some current memory designs have an area, timing and power impact because of this redundancy-option. Unfortunately, some memory designs that use redundancy are area inefficient, have a negative timing impact, and use excessive power. As such, there exists a need to improve conventional physical layout design implementations of memory architecture and related core circuitry so as to improve power, performance and area (PPA) of memory designs that use redundancy.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to memory architecture and related support circuitry for implementing memory multiplexing methodologies that may improve power, performance and area (PPA) efficiency of multi-purpose multiplexers for memories in infrastructure cores. The various multiplexing schemes and techniques described herein provide for improved architectural layout design of memory circuitry to improve single bank and multi-bank memory architecture with redundancy for dynamic memory multiplexing. To reduce impact of redundancy-option on area, timing, and power, the various multiplexing schemes and techniques described herein provide for a multi-purpose multiplexer design that seeks to reduce dynamic power, improve performance and timing, and enhance area efficiency with simpler circuit designs.

Various implementations of memory multiplexing schemes and techniques will now be described in detail herein with reference to FIGS. 1, 2A-2D, and 3A-3F.

Figure 1:
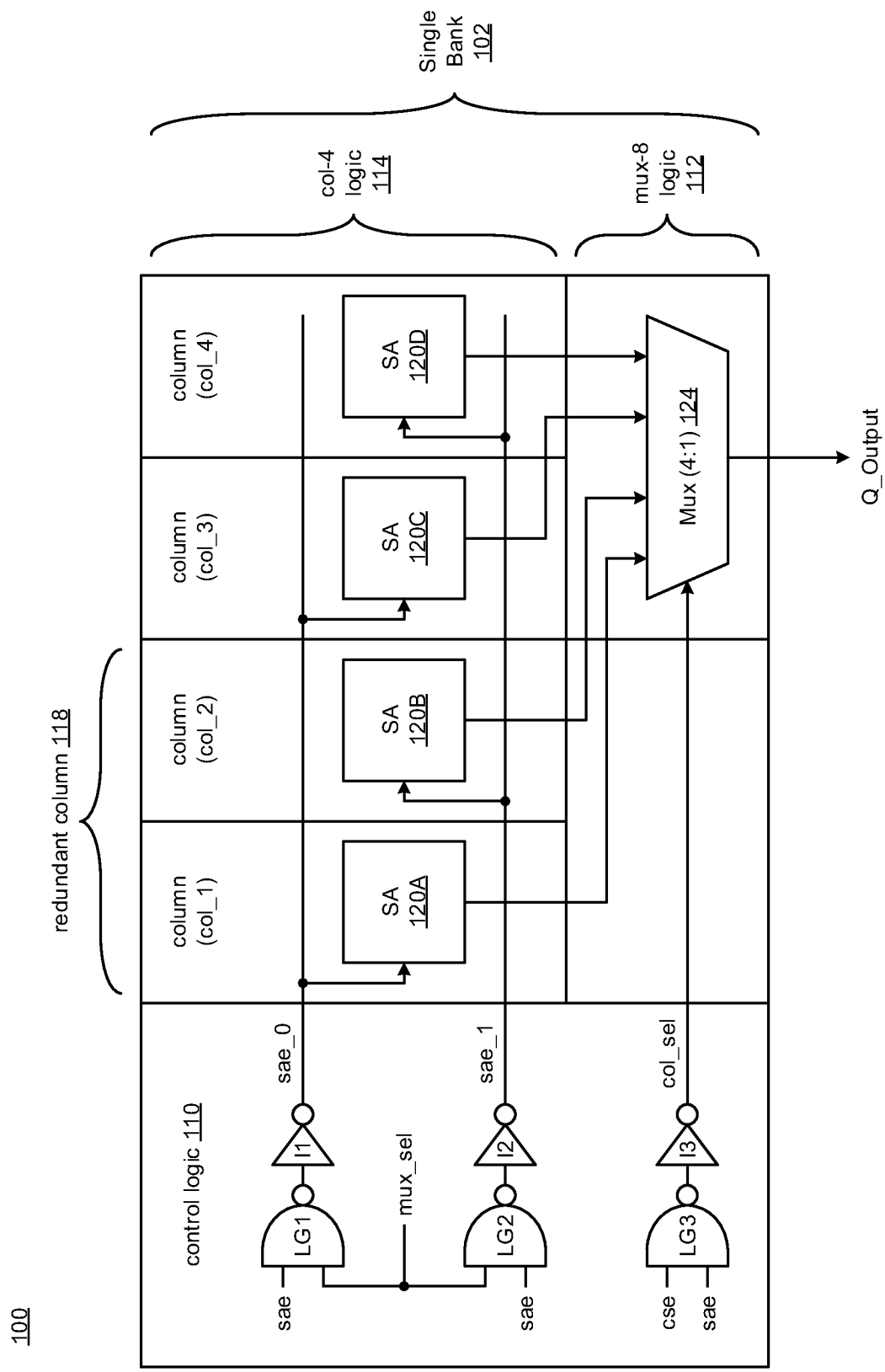
FIG. 1 illustrates a diagram of memory circuitry using single-bank multiplexing techniques in accordance with various implementations described herein.

FIG. 1 illustrates a diagram of single-bank memory circuitry 100 using single-bank multiplexing schemes and techniques in accordance with various implementations described herein. In some instances, the memory circuitry 100 may be implemented as a system or a device having various circuit components that are arranged and coupled together as an assemblage or some combination of parts that provide for a physical circuit design and related structures. In other instances, a method of designing, providing and building the memory circuitry 100 may involve use of circuit components described herein so as to implement memory multiplexing techniques associated therewith.

As shown in FIG. 1, the memory circuitry 100 includes single-bank memory 102 having various components, such as, e.g., control logic 110, multiplexer logic 112, and column logic 114. In some instances, the memory circuitry 100 may be configured as a single bank 102 of memory cells that are arranged in columns (col_1, col_2, col_3, col_4) along with redundant columns 118. The multiplexer logic 112 may be referred to as mux-8 logic, and the column logic 114 may be referred to as col-4 logic.

In some implementations, the memory circuitry 100 may have the single bank 102 of memory cells arranged in multiple columns (col_1, col_2, col_3, col_4), and each column of the multiple columns provides singe-bit data. As shown in FIG. 1, the multiple columns (col_1, col_2, col_3, col_4) of the single bank 102 includes a first column (col_1) that provides first single-bit data, a second column (col_2) that provides second single-bit data, a third column (col_3) that provides third single-bit data, and a fourth column (col_4) that provides fourth single-bit data. Also, one or more columns (e.g., col_1, col_2) of the multiple columns (col_1, col_2, col_3, col_4) may refer to one or more redundant columns 118 having redundant memory cells.

The memory circuitry 100 includes multiplexer circuitry having the multiplexer logic 112 that receives single-bit data from each column of the multiple columns (col_1, col_2, col_3, col_4) and provides selected data as output data (Q_Output). As shown in FIG. 1, each column of the multiple columns (col_1, col_2, col_3, col_4) in the single bank 102 may have a sense amplifier (SA: 120A, 120B, 120C, 120D) that provides single-bit data for each column based on a split sense amplifier enable (split-sae) signal. For instance, the split-sae signal refers to splitting the sae signal into a first sae signal (sae_0) and a second sae signal (sae_1).

The single bank 102 may include the control logic 110 that enables the sense amplifier (SA: 120A, 120B, 120C, 120D) in each column to provide each single-bit data corresponding to each column of the multiple columns (col_1, col_2, col_3, col_4) in the single bank 102. The single bank 102 may include four-column logic (col-4 logic 114) that provides first four-bit data as multi-bit data to the multiplexer logic 112, and the multiplexer logic 112 may have a multiplexer 124 that receives the multi-bit data from the four-column logic 114 and provides the selected data as the output data (Q_Output). The multiplexer 124 receives the first single-bit data from the first column (col_1), receives the second single-bit data from the second column (col_2), receives the third single-bit data from the third column (col_3), receives the fourth single-bit data from the fourth column (col_4), and provides the selected data as the output data (Q_Output).

The memory circuitry 100 may be implemented as an integrated circuit (IC) in using various types of memory, such as, e.g., random access memory (RAM), including static RAM (SRAM), magneto-resistive RAM (MRAM), and/or any other type of similar memory. The memory circuitry 100 may be implemented as an IC with single or dual rail memory architecture. The memory circuitry 100 may also be integrated with computing circuitry and related components on a single chip. Also, the memory circuitry 100 may be implemented in various embedded systems for various electronic, mobile and Internet-of-things (IoT) applications, including low power sensor nodes.

As shown in FIG. 1, the memory circuitry 100 may include the single bank 102 as core array circuitry (having an array of memory cells, wherein each memory cell may be referred to as a bitcell). Each memory cell may be configured to store at least one data bit value (e.g., a data value related to a logical '0' or '1'). The array of memory cells may include any number (N) of memory cells (or bitcells) that are arranged in various applicable configurations, such as, e.g., a two-dimensional (2D) memory array having any number (N) of columns (Ncolumns) and any number (N) of rows (Nrows) with memory cells arranged in a 2D grid pattern with associated indexing capabilities.

In various instances, each memory cell in the single bank 102 be implemented with RAM circuitry, or some other type of memory. For instance, each memory cell may include a multi-transistor static RAM (SRAM) cell, such as, e.g., 6T CMOS SRAM and/or various other types of complementary MOS (CMOS) SRAM cells, such as, e.g., 2T, 4T, 8T, or more transistors per bit. In other instances, each bitcell may include a multi-layer MRAM bitcell having free-layers and pinned layers. Also, RAM core circuitry may operate at various source voltage levels (e.g., Vdd, Vss, etc.) with a voltage range that varies with applicable technology for specific ICs.

In some implementations, the flexible-bank=2 circuit design shown in FIG. 1 supports column-redundancy for mux-8 architecture. Each repetitive col-4 logic includes an internal sense amplifier (SA) for simplifying mux-4 and mux-8 timing and for reducing bitline (BL) load. In this instance, the mux-8 select signal (address-bit) may be factored into the sae signal, and instead of using the same sae signal for all col-4 logic blocks, two unique sense-amp enable signals (sae_0 and sae_1) are used, wherein each sae signal is used to select corresponding col-4 logic depending on the mux-8 select input. In some instances, this multiplexing technique eliminates need for using an extra mux when using mux-8 logic, and when implementing column-redundancy, a 4:1 multiplexer may be used to select either the original column or the shifted redundant column.

Advantages may be achieved using this multiplexing technique. For instance, less area is used because separate mux-8 logic is not needed. Also, less dynamic power may be used because, instead of enabling multiple sense amplifiers, only one col-4 mux is enabled at a time, which may significantly reduce sense amplifier power (e.g., by half), and which translates to saving memory read power. Also, improved timing (access-time) may be achieved, e.g., by eliminating the 2:1 mux needed to do the mux-8 logic operation. Further, a simpler circuit design may be achieved, wherein the same margining scheme may be used for both mux-8 logic and mux-4 logic.

Figure 2A:
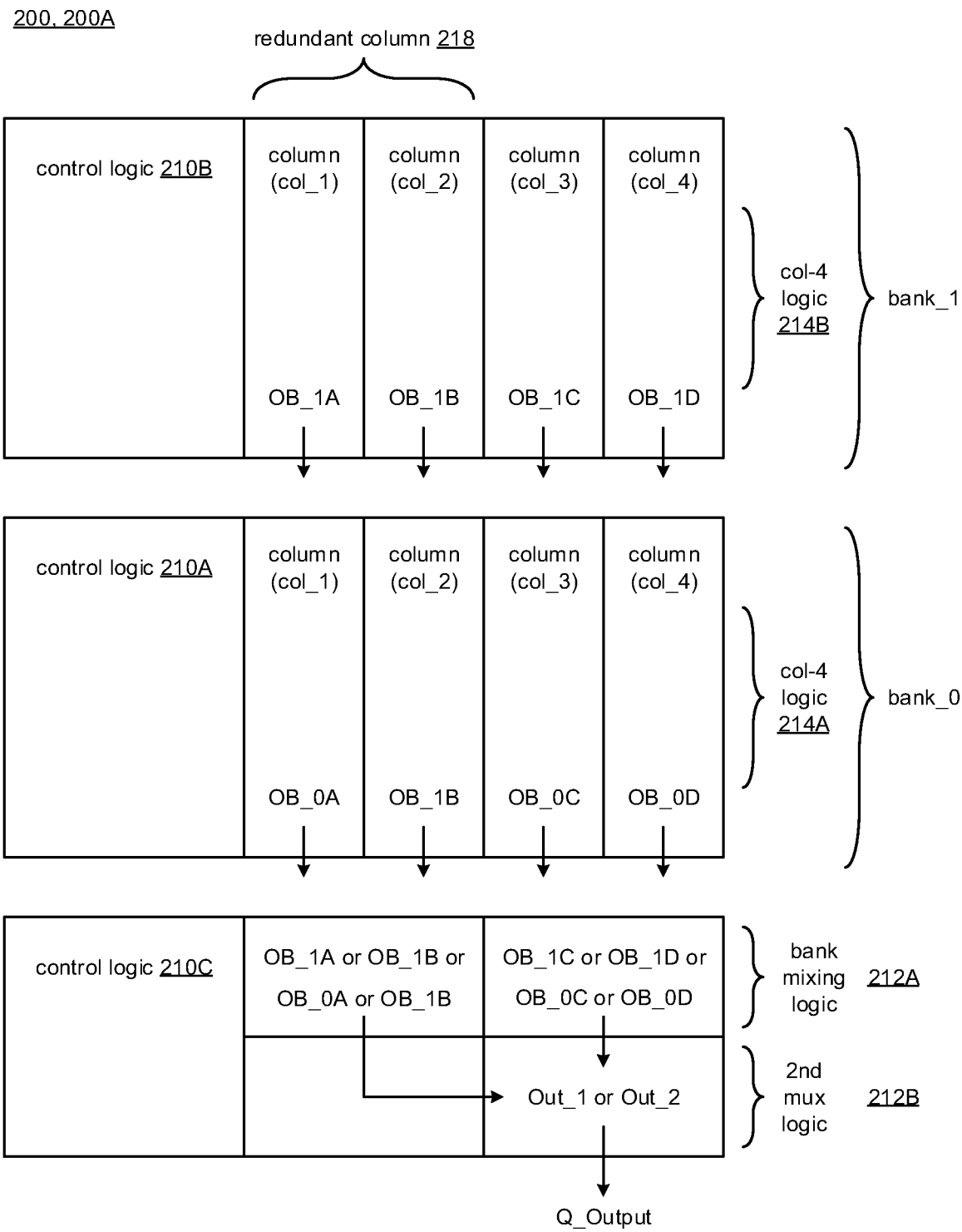
FIGS. 2A-2D illustrate various diagrams of memory circuitry using multi-bank multiplexing techniques in accordance with implementations described herein.
Figure 2B:
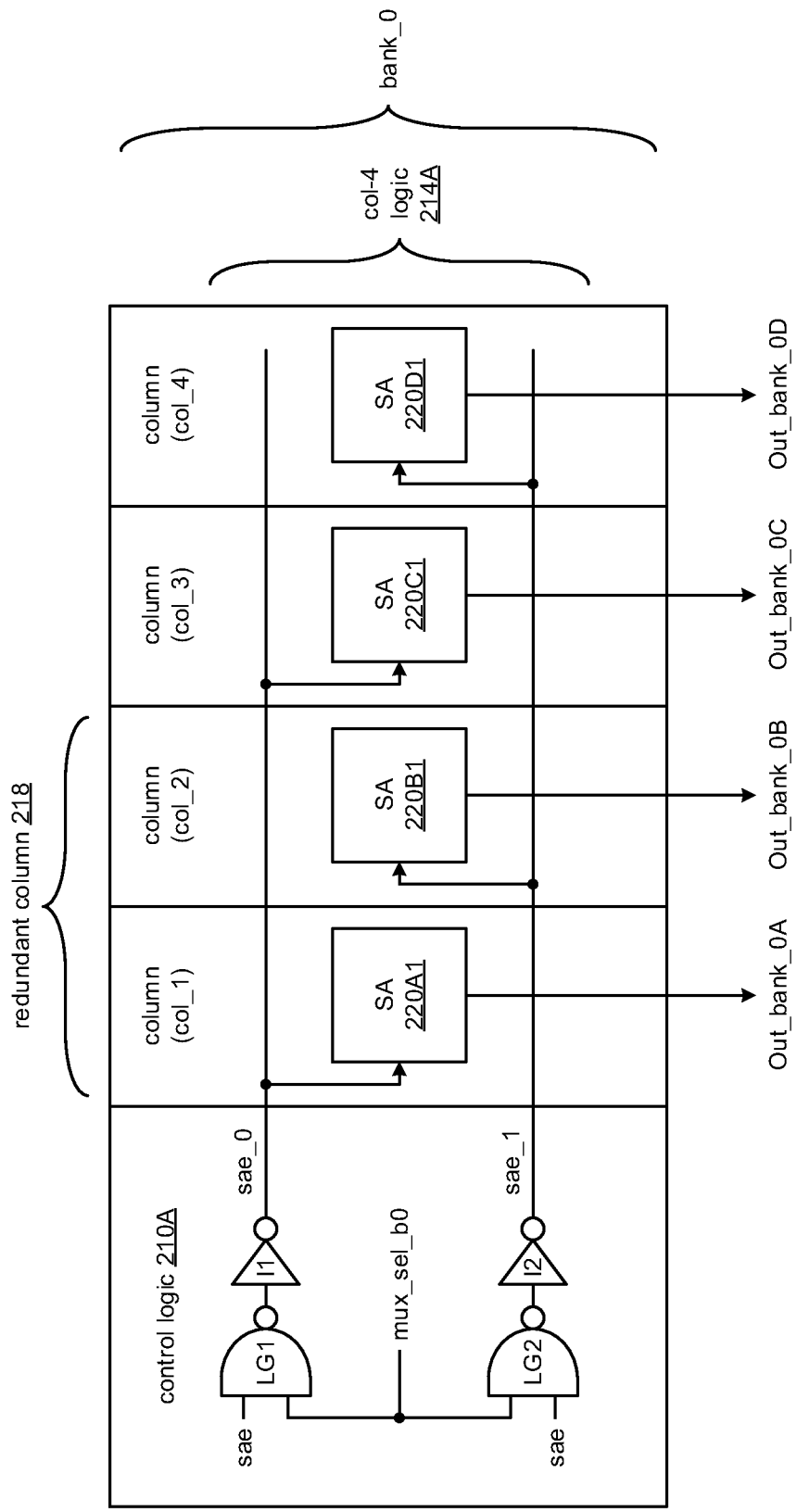
Figure 2C:
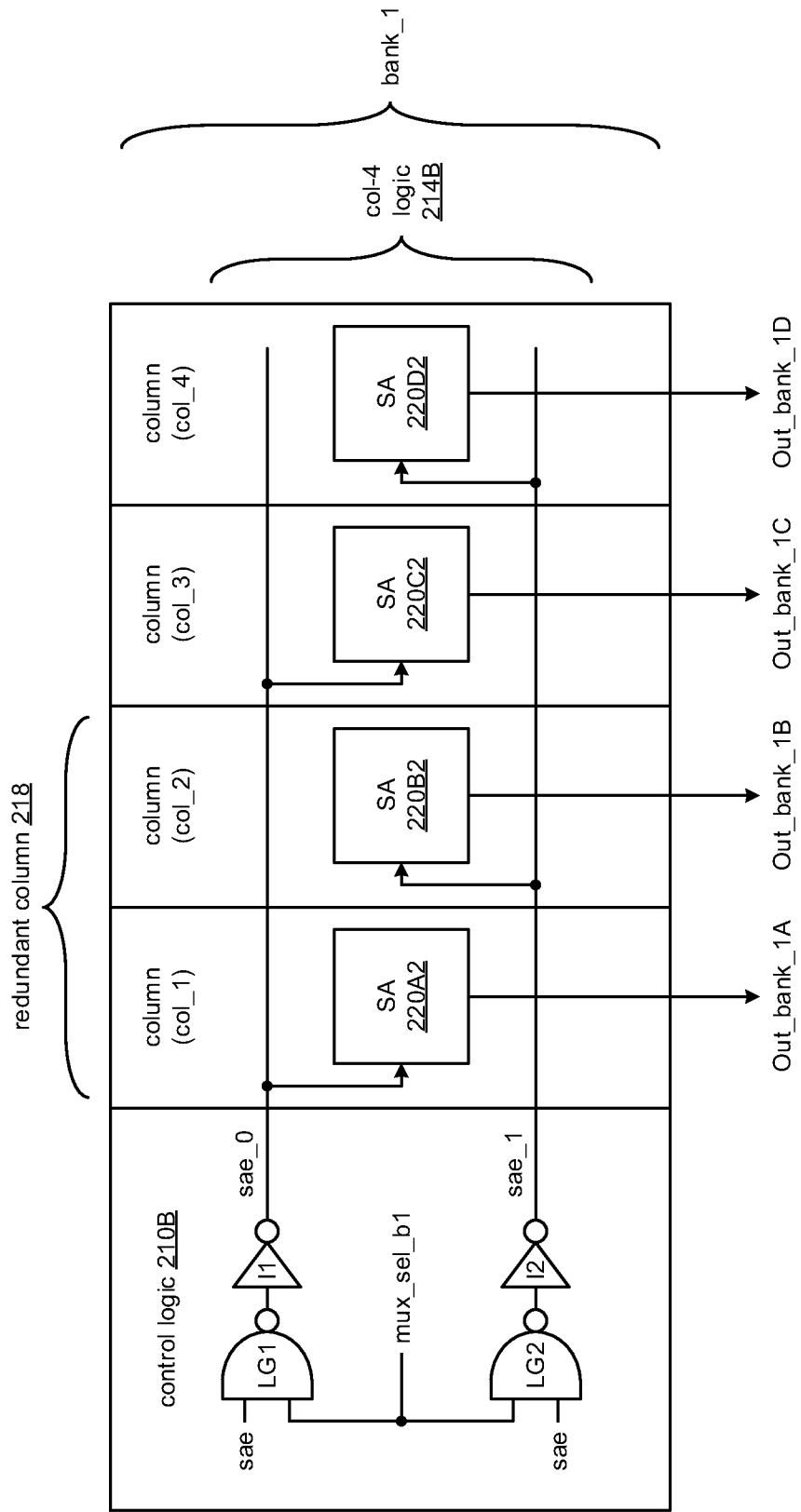
Figure 2D:
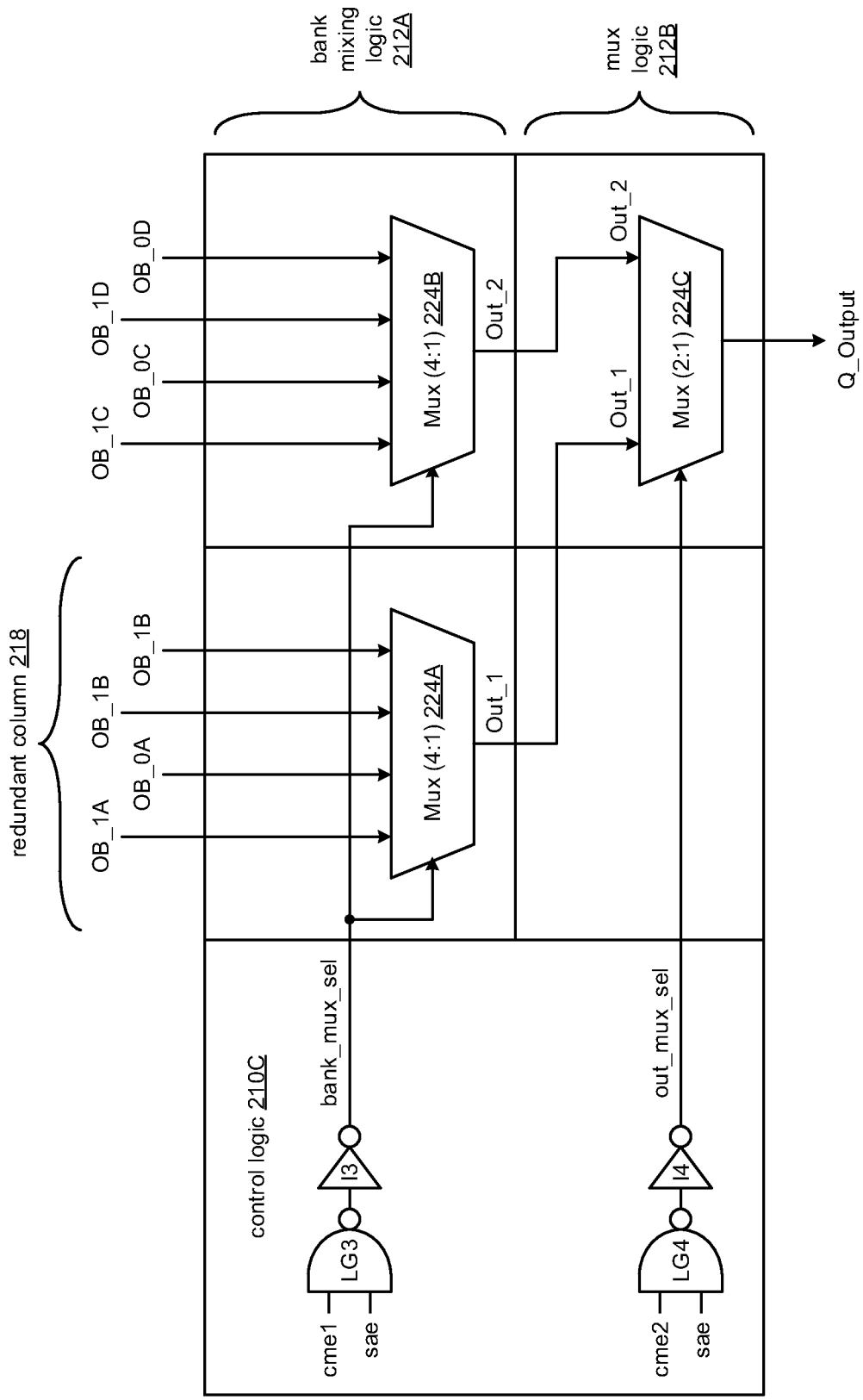

FIGS. 2A-2D illustrate various diagrams of memory circuitry 200 using multi-bank multiplexing schemes and techniques in accordance with various implementations described herein. In particular, FIG. 2A includes a diagram 200A of the memory circuitry 200, FIG. 2B shows a diagram 200B of a first bank (bank_0) of memory cells related to the memory circuitry 200, FIG. 2C shows a diagram 200C of a second bank (bank_1) of memory cells related to the memory circuitry 200, and also, FIG. 2D shows a diagram 200C of multiplexer circuitry (212A, 212B) related to the memory circuitry 200.

The memory circuitry 200 may be implemented as a system or a device having circuit components that are arranged and coupled together as an assemblage or some combination of parts that provide for a physical circuit design and related structures. Also, a method of designing, providing and building the memory circuitry 200 may involve use of various circuit components described herein so as to implement memory multiplexing schemes and techniques associated therewith. As described and shown, various devices in FIGS. 2A-2D have similar scope and features to similar devices in FIG. 1.

As shown in FIG. 2A, the memory circuitry 200 includes multi-bank memory (e.g., bank_0, bank_1) with various components, such as, e.g., control logic 210A, 210B, 210C, multiplexer logic 212A, 212B, and column logic 214A, 214B. The memory circuitry 200 may be configured with the multiple banks (bank_0, bank_1) of memory cells that are arranged in multiple columns (col_1, col_2, col_3, col_4) along with redundant columns 218. The column logic 214A, 214B may be referred to as col-4 logic. In some instances, one or more columns of the multiple columns (col_1, col_2, col_3, col_4) in each bank of the multiple banks (e.g., bank_0, bank_1) may refer to one or more redundant columns 218 having redundant memory cells.

The multi-bank memory circuitry 200 has multiple banks (e.g., bank_0, bank_1) of memory cells that are arranged in multiple columns (col_1, col_2, col_3, col_4), wherein each bank of the multiple banks (bank_0, bank_1) provides multi-bit data for the columns (col_1, col_2, col_3, col_4). The multiple banks (bank_0, bank_1) may include a first bank (bank_0) and a second bank (bank_1). The first bank (bank_0) includes columns (col_1, col_2, col_3, col_4) that provide multi-bit data (OB_0A, OB_0B, OB_0C, OB_0D), and the second bank (bank_1) may also include columns (col_1, col_2, col_3, col_4) that provide multi-bit data (OB_1A, OB_1B, OB_1C, OB_1D).

In some instances, the first bank (bank_0) may include a first column (col_1) that provides first data (OB_0A) of the multi-bit data. The first bank (bank_0) may include a second column (col_2) that provides second data (OB_0B) of the multi-bit data. The first bank (bank_0) may include a third column (col_3) that provides third data (OB_0C) of the multi-bit data. The first bank (bank_0) may include a fourth column (col_4) that provides fourth data (OB_0D) of the multi-bit data. The first bank (bank_0) may include first control logic 210A that is configured to select and provide the multi-bit data (OB_0A, OB_0B, OB_0C, OB_0D) to the bank mixing logic 212A.

In some instances, the second bank (bank_1) may include a first column (col_1) that provides first data (OB_1A) of the multi-bit data, and the second bank (bank_1) may include a second column (col_2) that provides second data (OB_1B) of the multi-bit data. The second bank (bank_1) may include a third column (col_3) that provides third data (OB_1C) of the multi-bit data, and the second bank (bank_1) may include a fourth column (col_4) that provides fourth data (OB_1D) of the multi-bit data. The second bank (bank_1) may include second control logic 210B that is configured to select and provide the multi-bit data (OB_1A, OB_1B, OB_1C, OB_1D) to the bank mixing logic 212A.

The memory circuitry 200 includes multiplexer circuitry having bank mixing logic 212A and multiplexer logic 212B. In some instances, the bank mixing logic 212A receives multi-bit data (OB_0A, OB_0B, OB_0C, OB_0D and OB_1A, OB_1B, OB_1C, OB_1D) from each bank of the multiple banks (bank_0, bank_1) and provides first selected data (Out_1 or Out_2), and also, the multiplexer logic 212B receives the first selected data (Out_1 or Out_2) from the bank mixing logic 212A and provides second selected data (Q_Output) as output data. For instance, as shown in FIG. 2A, a first part of the bank mixing logic 212A may receive multi-bit data (OB_0A, OB_0B and OB_1A, OB_1B) from the first and second columns (col_1, col_2) and provide a first part of the first selected data (Out_1) to the second multiplexer logic 212B. Also, a second part of the bank mixing logic 212A may receive multi-bit data (OB_0C, OB_0D and OB_1C, OB_1D) from the third and fourth columns (col_3, col_4) and provide a second part of the first selected data (Out_2) to the second multiplexer logic 212B. The multiplexer circuitry may include third control logic 210C that is coupled to the bank mixing logic 212A so as to select and provide the first selected data (Out_1, Out_2) to the second multiplexer logic 212B. Further, the third control logic 210C may be coupled to the second multiplexer logic 212B so as to select and provide the second selected data (Q_Output) as the output data.

As shown in FIGS. 2B-2C, each bank of the multiple banks (bank_0, bank_1) has sense amplifier circuitry with a sense amplifier (SA) for each column of the multiple columns (col_1, col_2, col_3, col_4) in each bank based on a split sense amplifier enable (split-sae) signal (e.g., sae_0, sae_1). In some instances, each sense amplifier (SA) may provide single-bit data for each column, and the multi-bit data includes multiple single-bit data corresponding to the columns (col_1, col_2, col_3, col_4) in each bank of the multiple banks (bank_0, bank_1). In addition, each bank of the multiple banks (bank_0, bank_1) may include control logic 210A, 210B that enables each sense amplifier (SA) to provide each single-bit data corresponding to each column of the columns (col_1, col_2, col_3, col_4) in each bank of the multiple banks (bank_0, bank_1).

As shown in FIG. 2B, the first bank (bank_0) of memory cells may include a first column (col_1) with a sense amplifier (SA: 220A1) that is configured to provide first data (Out_Bank_0A) based on a first sae signal (sae_0). Also, the first bank (bank_0) of memory cells may include a second column (col_2) with a sense amplifier (SA: 220B1) that is configured to provide second data (Out_Bank_0B) based on a second sae signal (sae_1). The first bank (bank_0) of memory cells may include a third column (col_3) with a sense amplifier (SA: 220C1) that is configured to provide third data (Out_Bank_0C) based on the first sae signal (sae_0). The first bank (bank_0) of memory cells may include a fourth column (col_4) with a sense amplifier (SA: 220D1) that is configured to provide fourth data (Out_Bank_0D) based on the second sae signal (sae_1).

The first bank (bank_0) of memory cells may include the control logic 210A that has logic gates (e.g., AND gates: LG1, LG2) and buffer gates (e.g., inverters: I1, I2). The control logic 210A includes first logic gates (LG1, I1) that receive a sense amplifier enable (sae) signal, receive a first multiplexer select signal (mux_sel_b0), and provide the first sae signal (sae_0) to the sense amplifier (SA: 220A1) in the first column (col_1) and to the sense amplifier (SA: 220C1) in the third column (col_3). The control logic 210A includes second logic gates (LG2, I2) that receive the sense amplifier enable (sae) signal, receive the first multiplexer select signal (mux_sel_b0), and provide the second sae signal (sae_1) to the sense amplifier (SA: 220B1) in the second column (col_2) and to the sense amplifier (SA: 220D1) in the fourth column (col_4).

As shown in FIG. 2C, the second bank (bank_1) of memory cells may include a first column (col_1) with a sense amplifier (SA: 220A2) that is configured to provide first data (Out_Bank_1A) based on a first sae signal (sae_0). Also, the second bank (bank_1) of memory cells may include a second column (col_2) with a sense amplifier (SA: 220B2) that is configured to provide second data (Out_Bank_113) based on a second sae signal (sae_1). The second bank (bank_1) of memory cells may include a third column (col_3) with a sense amplifier (SA: 220C2) that is configured to provide third data (Out_Bank_1C) based on the first sae signal (sae_0). Also, the second bank (bank_1) of memory cells may include a fourth column (col_4) with a sense amplifier (SA: 220D12) that is configured to provide fourth data (Out_Bank_1D) based on the second sae signal (sae_1).

The second bank (bank_1) of memory cells may include the control logic 210B that has logic gates (e.g., AND gates: LG1, LG2) and buffer gates (e.g., inverters: I1, I2). The control logic 210B includes first logic gates (LG1, I1) that receive a sense amplifier enable (sae) signal, receive a second multiplexer select signal (mux_sel_b1), and provide the first sae signal (sae_0) to the sense amplifier (SA: 220A2) in the first column (col_1) and to the sense amplifier (SA: 220C2) in the third column (col_3). The control logic 210B includes second logic gates (LG2, I2) that receive the sense amplifier enable (sae) signal, receive the second multiplexer select signal (mux_sel_b1), and provide the second sae signal (sae_1) to the sense amplifier (SA: 220B2) in the second column (col_2) and to the sense amplifier (SA: 220D2) in the fourth column (col_4).

As shown in FIGS. 2B-2C, the multiple banks (bank_0, bank_1) may include the first bank (bank_0 in FIG. 2B) that provides the first multi-bit data (OB_0A, OB_0B, OB_0C, OB_0D) and the second bank (bank_1 in FIG. 2C) that provides the second multi-bit data (OB_1A, OB_1B, OB_1C, OB_1D). Also, in some instances, the first bank (bank_0) may have first four-column logic 214A that may provide first four-bit data as the multi-bit data (OB_0A, OB_0B, OB_0C, OB_0D), and the second bank (bank_1) may have second four-column logic 214B that may provide second four-bit data as the multi-bit data (OB_1A, OB_1B, OB_1C, OB_1D).

In some implementations, as shown in FIG. 2D, the bank mixing logic 212A may have a first multiplexer 224A that receives a part (OB_0A, OB_0B) of the first four-bit data (OB_0A, OB_0B, OB_0C, OB_0D) from the first four-column logic 214A of the first bank (bank_0), receives a part (OB_1A, OB_1B) of the second four-bit data (OB_1A, OB_1B, OB_1C, OB_1D) from the second four-column logic 214B of the second bank (bank_1), and provides first data (Out_1) of first selected data (Out_1 or Out_2) based on a bank_mux_sel signal. Also, the bank mixing logic 212A may have a second multiplexer 224B that receives another part (OB_0C, OB_0D) of the first four-bit data (OB_0A, OB_0B, OB_0C, OB_0D) from the first four-column logic 214A of the first bank (bank_0), receives another part (OB_1C, OB_1D) of the second four-bit data (OB_1A, OB_1B, OB_1C, OB_1D) from the second four-column logic 214B of the second bank (bank_1), and provides second data (Out_2) of first selected data (Out_1 or Out_2) based on the bank_mux_sel signal. The multiplexer logic 212A, 212B may include a third multiplexer 224C that receives the first data (Out_1) of first selected data (Out_1 or Out_2) from the first multiplexer 224A, receives the second data (Out_2) of first selected data (Out_1 or Out_2) from the second multiplexer 224B, and also provides the second selected data (Q_Output) as output data based on an out_mux_sel signal.

Further, as shown in FIG. 2D, the multiplexer circuitry (212A, 212B) may also include control logic 210C that has logic gates (e.g., AND gates: LG3, LG4) and buffer gates (e.g., inverters: I3, I4). The control logic 210C includes third logic gates (LG3, I3) that receive the sae signal, receive a first column multiplexer enable (cme1) signal, and provide the bank multiplexer select signal (bank_mux_sel) to the first mux 224A and the second mux 224B. Also, the control logic 210C includes fourth logic gates (LG4, I4) that receive the sae signal, receive the second column multiplexer enable (cme2) signal, and provide the output multiplexer select signal (out_mux_sel) to the third mux 224C.

The memory circuitry 200 may be implemented as an integrated circuit (IC) in using various types of memory, such as, e.g., random access memory (RAM), including static RAM (SRAM), magneto-resistive RAM (MRAM), and/or any other type of similar memory. The memory circuitry 200 may be implemented as an IC with single or dual rail memory architecture. The memory circuitry 200 may also be integrated with computing circuitry and related components on a single chip. Also, the memory circuitry 200 may be implemented in various embedded systems for various electronic, mobile and Internet-of-things (IoT) applications, including low power sensor nodes.

As shown in FIGS. 2A-2D, the memory circuitry 200 includes multiple banks as multi-bank core array circuitry (wherein each bank has an array of memory cells, and each memory cell may be referred to as a bitcell). Each memory cell may be configured to store at least one data bit value (e.g., a data value related to a logical '0' or '1'). Each array of memory cells may include any number (N) of memory cells (or bitcells) arranged in various applicable configurations, such as, e.g., a two-dimensional (2D) memory array having any number (N) of columns (Ncolumns) and any number (N) of rows (Nrows) with memory cells arranged in a 2D grid pattern with associated indexing capabilities.

In various instances, each memory cell in each bank be implemented with RAM circuitry, or some other type of memory. For instance, each memory cell may include a multi-transistor static RAM (SRAM) cell, such as, e.g., 6T CMOS SRAM and/or various other types of complementary MOS (CMOS) SRAM cells, such as, e.g., 2T, 4T, 8T, or more transistors per bit. In other instances, each bitcell may include a multi-layer MRAM bitcell having free-layers and pinned layers. Also, the RAM core circuitry may operate at various source voltage levels (e.g., Vdd, Vss, etc.) with a voltage range that varies with applicable technology for specific ICs.

In some implementations, the flexible-bank=4 (multi-bank) circuit design shown in FIGS. 2A-2D supports column-redundancy for mux-8 architecture. For instance, each repetitive col-4 logic may have an internal sense amplifier (SA) for simplifying mux-4 and mux-8 timing and for reducing bitline (BL) load. In this instance, the mux-8 select signal (address-bit) may be factored into the sae signal, and instead of using the same sae signal for all of the col-4 logic blocks, two unique sense-amp enable signals (sae_0 and sae_1) are used, wherein each sae signal is used to select corresponding col-4 logic depending on the mux-8 select input. In some instances, this multiplexing technique eliminates the need for extra mux to implement mux-8 logic, and also, the multi-bank selection and the mux-8 logic may be combined into a single 4:1 mux. As such, this multiplexing technique may assist with selecting the needed col-4 logic block from either the top-bank (bank_1) or bottom-bank (bank_0). To implement column-redundancy, the original 2:1 mux may be used to select either the original column or the shifted redundant column.

Advantages may be achieved using this multiplexing technique. For instance, less area is used because separate mux-8 logic is not needed. Also, less dynamic power may be used because, instead of enabling multiple sense amplifiers, only one col-4 mux is enabled at a time, which may significantly reduce sense amplifier power (e.g., by half), and which translates to saving memory read power. Also, improved timing (access-time) may be achieved, e.g., by eliminating the 2:1 mux needed to do the mux-8 logic operation. Further, a simpler circuit design may be achieved, wherein the same margining scheme may be used for both mux-8 logic and mux-4 logic.

Figure 3A:
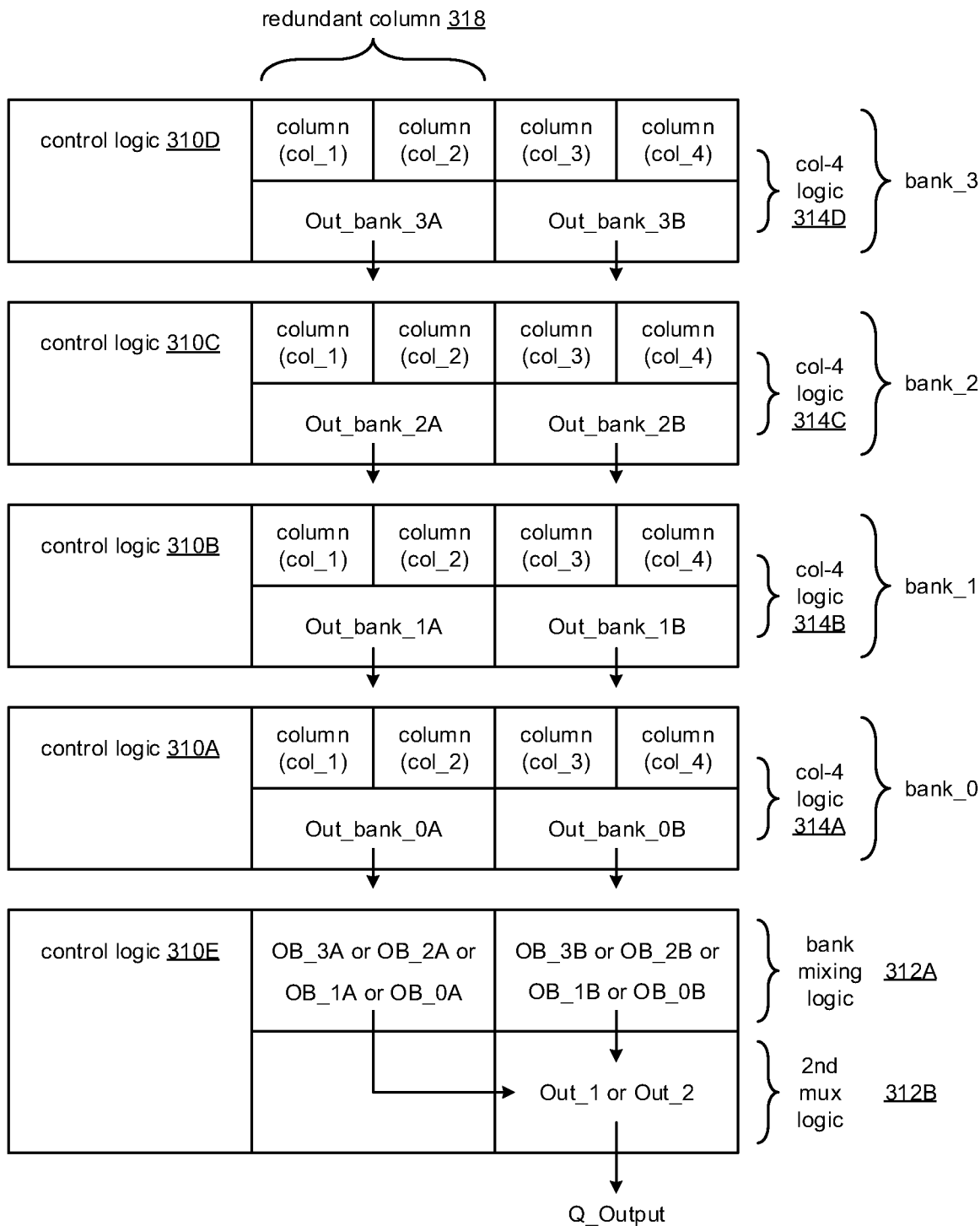
FIGS. 3A-3F illustrate various diagrams of memory circuitry using multi-bank multiplexing techniques in accordance with implementations described herein.
Figure 3B:
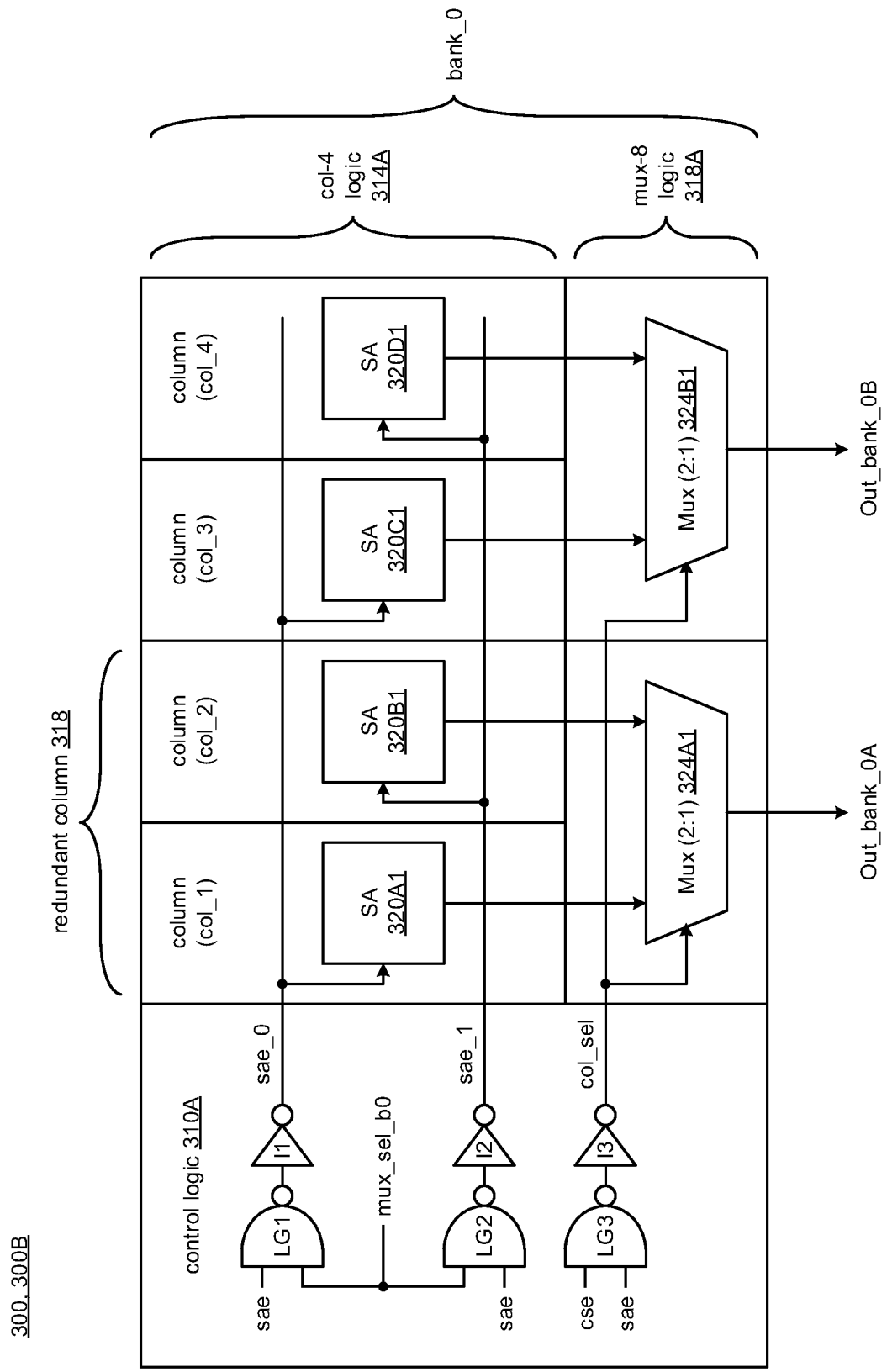
Figure 3C:
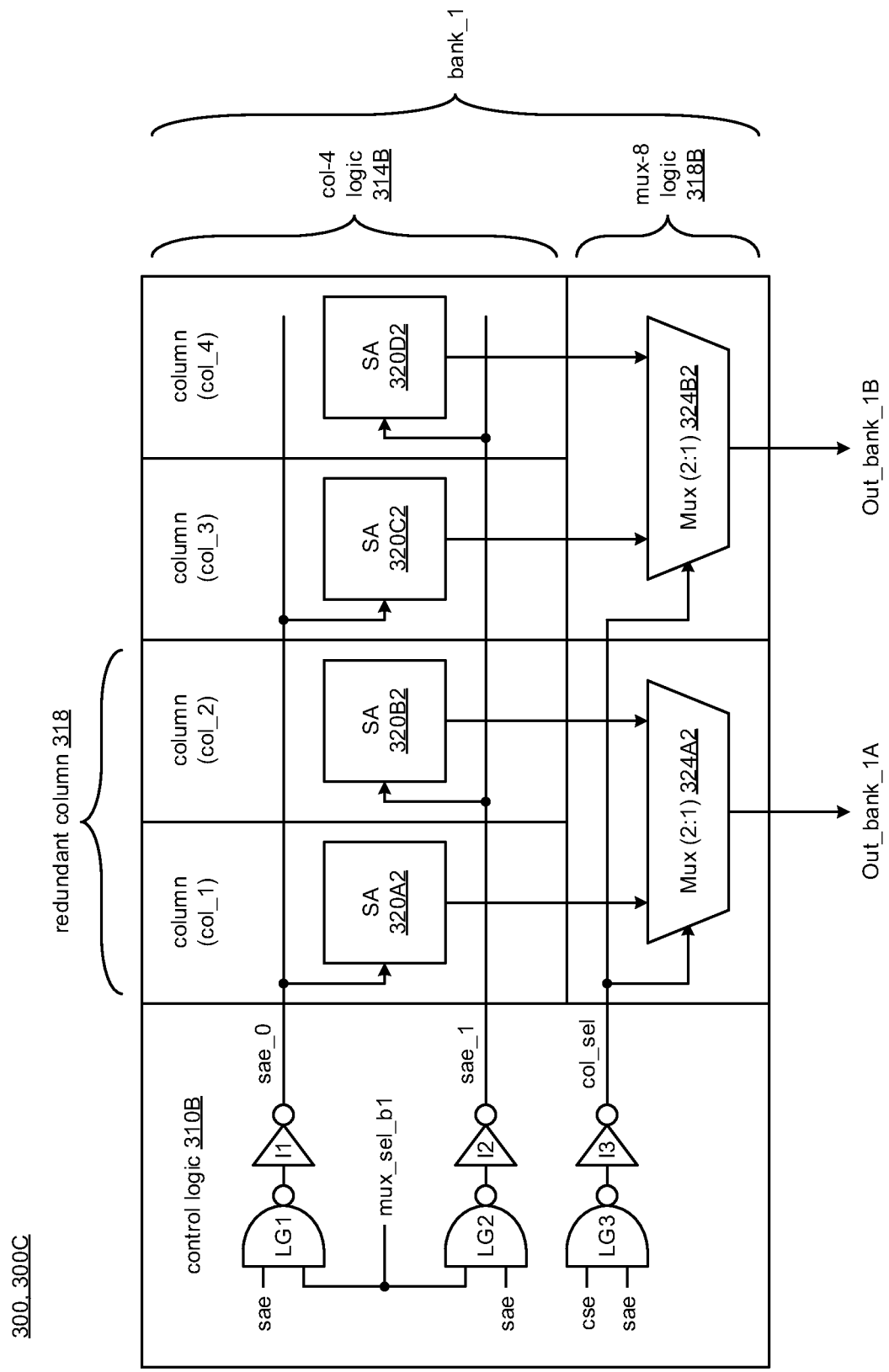
Figure 3D:
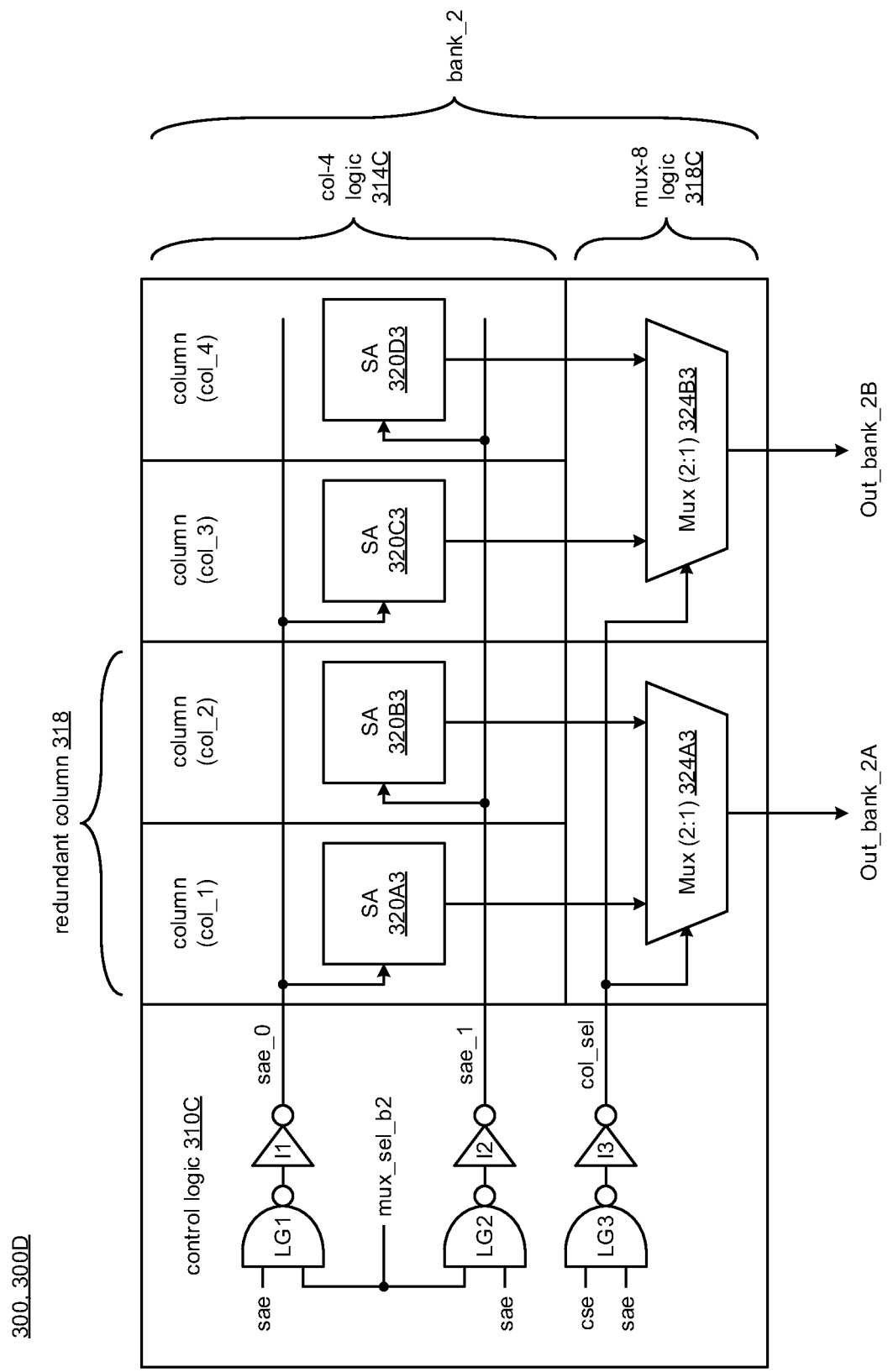
Figure 3E:
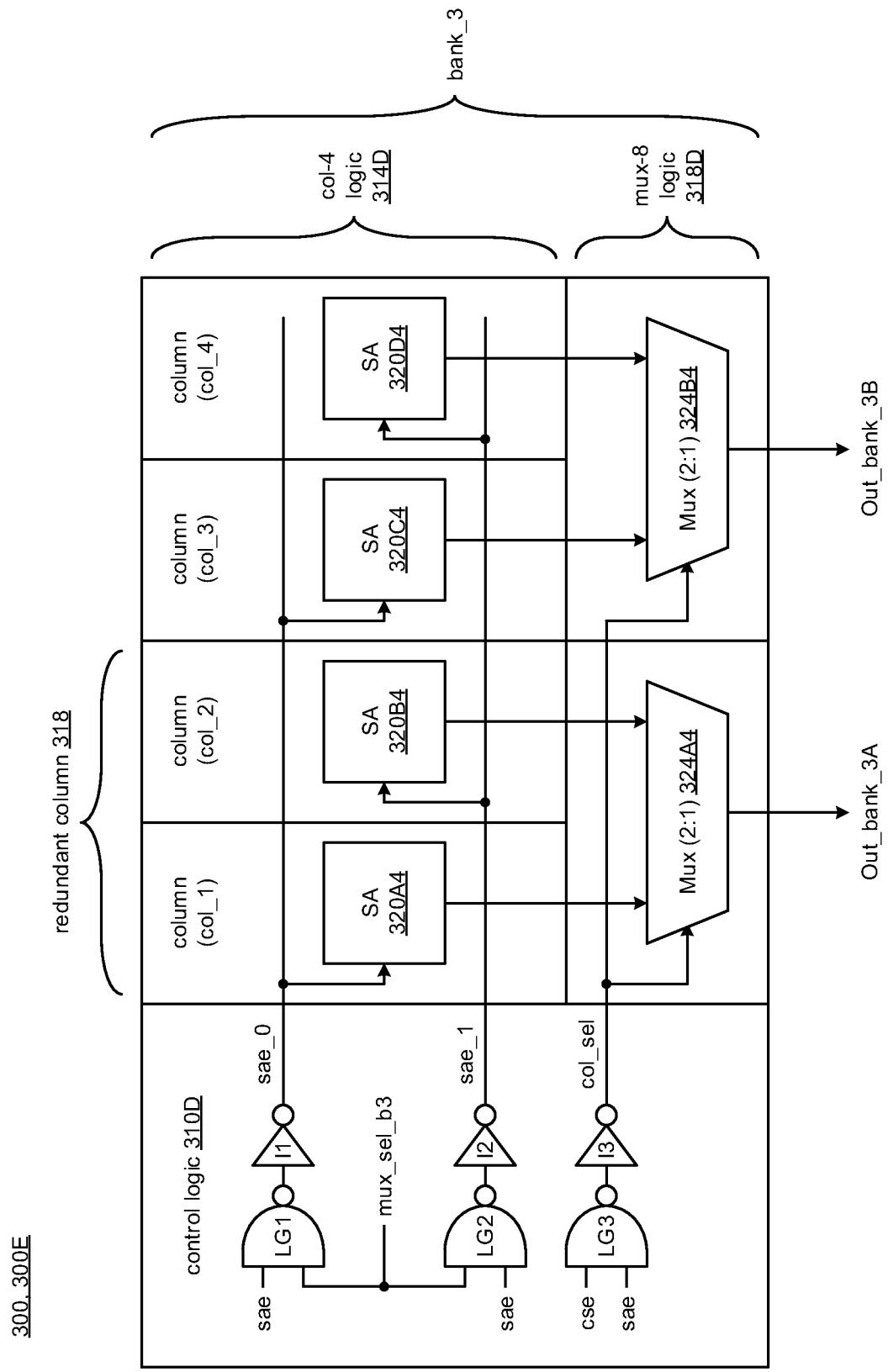
Figure 3F:
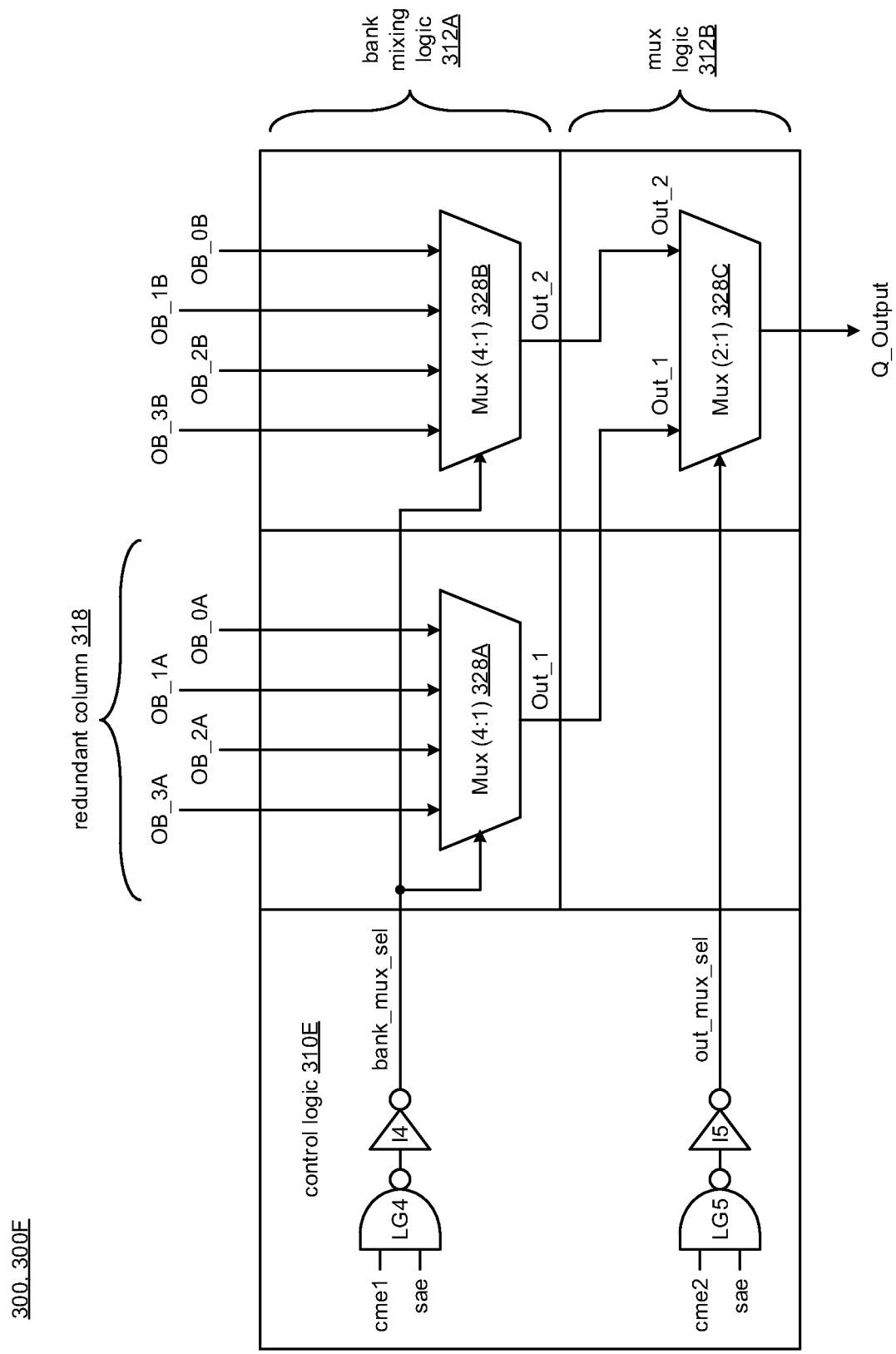

FIGS. 3A-3F illustrate various diagrams of memory circuitry 300 using multi-bank multiplexing schemes and techniques in accordance with various implementations described herein. In particular, FIG. 3A includes a diagram 300A of the memory circuitry 300, FIG. 3B shows a diagram 300B of a first bank (bank_0) of memory cells related to the memory circuitry 300, FIG. 3C shows a diagram 300C of a second bank (bank_1) of memory cells related to the memory circuitry 300, FIG. 3D shows a diagram 300D of a third bank (bank_2) of memory cells related to the memory circuitry 300, FIG. 3E shows a diagram 300E of a fourth bank (bank_3) of memory cells related to the memory circuitry 300, and also, FIG. 3F shows a diagram 300F of multiplexer circuitry (312A, 312B) related to the memory circuitry 300.

The memory circuitry 300 may be implemented as a system or a device having circuit components arranged and coupled together as an assemblage or a combination of parts that provide for a physical circuit design with related structures. Also, a method of designing, providing and building the memory circuitry 300 may involve use of the various circuit components described herein so as to implement memory multiplexing schemes and techniques associated therewith. Further, the various devices in FIGS. 3A-3D may have similar scope and features to similar devices in FIGS. 1, 2A-2D.

As shown in FIG. 3A, the memory circuitry 300 includes multi-bank memory circuitry having multiple banks (bank_0, bank_1, bank_2, bank_3) of memory cells that are arranged in multiple columns (col_1, col_2, col_3, col_4). In some instances, each bank of the multiple banks (bank_0, bank_1, bank_2, bank_3) may have first multiplexer logic 318A, 318B, 318C, 318D that provides multi-bit data (Out_Bank: OB) for the multiple columns (col_1, col_2, col_3, col_4).

The memory circuitry 300 may include multiplexer circuitry 312A, 312B having bank mixing logic 312A and second multiplexer logic 312B. In some instances, the bank mixing logic 312A receives the multi-bit data from the first multiplexer logic 318A, 318B, 318C, 318D in each bank of the multiple banks (bank_0, bank_1, bank_2, bank_3) and provides first selected data (Out_1, Out_2) to the second multiplexer logic 312B. The second multiplexer logic 312B may receive the first selected data (Out_1, Out_2) from the bank mixing logic 312A and provide second selected data (Q_Output) as output data.

As shown in FIGS. 3B-3E, each bank of the multiple banks (bank_0, bank_1, bank_2, bank_3) may have sense amplifier circuitry with a sense amplifier (SA) for each column of the multiple columns (col_1, col_2, col_3, col_4) in each bank based on a split sense amplifier enable (split-sae) signal (sae_0, sae_1). In some instances, each sense amplifier (SA) may provide single-bit data for each column, and multi-bit data may refer to multiple single-bit data corresponding to the multiple columns (col_1, col_2, col_3, col_4) in each bank of the multiple banks (bank_0, bank_1, bank_2, bank_3). Also, each bank of the multiple banks (bank_0, bank_1, bank_2, bank_3) may include control logic (310A, 310B, 310C, 310D) that enables each sense amplifier (SA) to provide each single-bit data corresponding to each column of the multiple columns (col_1, col_2, col_3, col_4) in each bank of the multiple banks (bank_0, bank_1, bank_2, bank_3). Also, one or more columns of the multiple columns (col_1, col_2, col_3, col_4) in each bank of the multiple banks (bank_0, bank_1, bank_2, bank_3) refer to one or more the redundant columns 318 having redundant memory cells.

As shown in FIG. 3B, the first bank (bank_0) of memory cells may include a first column (col_1) with a sense amplifier (SA: 320A1) that is configured to provide single-bit data to first mux 324A1 based on the first sae signal (sae_0). The first bank (bank_0) of memory cells may include a second column (col_2) with a sense amplifier (SA: 320B1) that is configured to provide single-bit data to the first mux 324A1 based on the second sae signal (sae_1). The first mux 324A1 may be configured to receive single-bit data from the sense amplifiers (SA: 320A1, 320B1) and provide first data (Out_Bank_0A) based on a column select signal (col_sel). The first bank (bank_0) of memory cells may include a third column (col_3) with a sense amplifier (SA: 320C1) that is configured to provide single-bit data to second mux 324B1 based on the first sae signal (sae_0). The first bank (bank_0) of memory cells may include a fourth column (col_4) with a sense amplifier (SA: 320D1) that is configured to provide single-bit data to the second mux 324B1 based on the second sae signal (sae_1). The second mux 324B1 may be configured to receive single-bit data from the sense amplifiers (SA: 320C1, 320D1) and provide second data (Out_Bank_0B) based on the column select signal (col_sel).

The first bank (bank_0) of memory cells may include the control logic 310A that has logic gates (e.g., AND gates: LG1, LG2, LG3) and buffer gates (e.g., inverters: I1, I2, I3). The control logic 310A includes first logic gates (LG1, I1) that receive the sense amplifier enable (sae) signal, receive the first multiplexer select signal (mux_sel_b0), and provide the first sae signal (sae_0) to the sense amplifier (SA: 320A1) in the first column (col_1) and to the sense amplifier (SA: 320C1) in the third column (col_3). The control logic 310A includes second logic gates (LG2, I2) that receive the sense amplifier enable (sae) signal, receive the first multiplexer select signal (mux_sel_b0), and provide the second sae signal (sae_1) to the sense amplifier (SA: 320B1) in the second column (col_2) and to the sense amplifier (SA: 320D1) in the fourth column (col_4). The control logic 310A includes third logic gates (LG3, I3) that receive the sense amplifier enable (sae) signal, receive a column select enable (cse) signal, and provide the column select signal (col_sel) to the first mux 324A1 and the second mux 324B1.

As shown in FIG. 3C, the second bank (bank_1) of memory cells may include a first column (col_1) with a sense amplifier (SA: 320A2) that is configured to provide single-bit data to first mux 324A2 based on the first sae signal (sae_0). The second bank (bank_1) of memory cells may include a second column (col_2) with a sense amplifier (SA: 320B2) that is configured to provide single-bit data to the first mux 324A2 based on the second sae signal (sae_1). The first mux 324A2 may be configured to receive single-bit data from sense amplifiers (SA: 320A2, 320B2) and provide third data (Out_Bank_1A) based on the column select signal (col_sel). The second bank (bank_1) of memory cells may include a third column (col_3) with a sense amplifier (SA: 320C2) that is configured to provide single-bit data to second mux 324B2 based on the first sae signal (sae_0). The second bank (bank_1) of memory cells may include a fourth column (col_4) with a sense amplifier (SA: 320D2) configured to provide single-bit data to the second mux 324B2 based on the second sae signal (sae_1). The second mux 324B2 may be configured to receive single-bit data from the sense amplifiers (SA: 320C2, 320D2) and provide fourth data (Out_Bank_16) based on the column select signal (col_sel).

The second bank (bank_1) of memory cells may include the control logic 310B that has logic gates (e.g., AND gates: LG1, LG2, LG3) and buffer gates (e.g., inverters: I1, I2, I3). The control logic 310B includes first logic gates (LG1, I1) that receive the sense amplifier enable (sae) signal, receive the second multiplexer select signal (mux_sel_b1), and provide the first sae signal (sae_0) to the sense amplifier (SA: 320A2) in the first column (col_1) and to the sense amplifier (SA: 320C2) in the third column (col_3). The control logic 310B includes second logic gates (LG2, I2) that receive the sense amplifier enable (sae) signal, receive the second multiplexer select signal (mux_sel_b1), and provide the second sae signal (sae_1) to the sense amplifier (SA: 320B2) in the second column (col_2) and to the sense amplifier (SA: 320D2) in the fourth column (col_4). The control logic 310B includes third logic gates (LG3, I3) that receive the sense amplifier enable (sae) signal, receive the column select enable (cse) signal, and provide the column select signal (col_sel) to the first mux 324A2 and the second mux 324B2.

As shown in FIG. 3D, the third bank (bank_2) of memory cells may include a first column (col_1) with a sense amplifier (SA: 320A3) that is configured to provide single-bit data to first mux 324A3 based on the first sae signal (sae_0). The third bank (bank_2) of memory cells may include a second column (col_2) with a sense amplifier (SA: 320B3) that is configured to provide single-bit data to the first mux 324A3 based on the second sae signal (sae_1). The first mux 324A3 may be configured to receive single-bit data from the sense amplifiers (SA: 320A3, 320B3) and provide fifth data (Out_Bank_2A) based on the column select signal (col_sel). The third bank (bank_2) of memory cells may include a third column (col_3) with a sense amplifier (SA: 320C3) that is configured to provide single-bit data to second mux 324B3 based on the first sae signal (sae_0). The third bank (bank_2) of memory cells may include a fourth column (col_4) with a sense amplifier (SA: 320D3) that is configured to provide single-bit data to the second mux 324B3 based on the second sae signal (sae_1). The second mux 324B3 may be configured to receive single-bit data from the sense amplifiers (SA: 320C3, 320D3) and provide sixth data (Out_Bank_26) based on the column select signal (col_sel).

The third bank (bank_2) of memory cells may include the control logic 310C that has logic gates (e.g., AND gates: LG1, LG2, LG3) and buffer gates (e.g., inverters: I1, I2, I3). The control logic 310C includes first logic gates (LG1, I1) that receive the sense amplifier enable (sae) signal, receive a third multiplexer select signal (mux_sel_b2), and provide the first sae signal (sae_0) to the sense amplifier (SA: 320A3) in the first column (col_1) and to the sense amplifier (SA: 320C3) in the third column (col_3). The control logic 310C includes second logic gates (LG2, I2) that receive the sense amplifier enable (sae) signal, receive the third multiplexer select signal (mux_sel_b2), and provide the second sae signal (sae_1) to the sense amplifier (SA: 320B3) in the second column (col_2) and to the sense amplifier (SA: 320D3) in the fourth column (col_4). The control logic 310C includes third logic gates (LG3, I3) that receive the sense amplifier enable (sae) signal, receive the column select enable (cse) signal, and provide the column select signal (col_sel) to the first mux 324A3 and the second mux 324B3.

As shown in FIG. 3E, the fourth bank (bank_3) of memory cells include a first column (col_1) with a sense amplifier (SA: 320A4) that is configured to provide single-bit data to first mux 324A4 based on the first sae signal (sae_0). The fourth bank (bank_3) of memory cells may include a second column (col_2) with a sense amplifier (SA: 320B4) that is configured to provide single-bit data to the first mux 324A4 based on the second sae signal (sae_1). The first mux 324A4 may be configured to receive single-bit data from sense amplifiers (SA: 320A4, 320B4) and provide seventh data (Out_Bank_3A) based on the column select signal (col_sel). The fourth bank (bank_3) of memory cells may include a third column (col_3) with a sense amplifier (SA: 320C4) that is configured to provide single-bit data to second mux 324B4 based on the first sae signal (sae_0). The fourth bank (bank_3) of memory cells may include a fourth column (col_4) with a sense amplifier (SA: 320D4) that is configured to provide single-bit data to the second mux 324B4 based on the second sae signal (sae_1). The second mux 324B4 may be configured to receive single-bit data from the sense amplifiers (SA: 320C4, 320D4) and provide eighth data (Out_Bank_3B) based on the column select signal (col_sel).

The fourth bank (bank_3) of memory cells may include the control logic 310D that has logic gates (e.g., AND gates: LG1, LG2, LG3) and buffer gates (e.g., inverters: I1, I2, I3). The control logic 310D includes first logic gates (LG1, I1) that receive the sense amplifier enable (sae) signal, receive a fourth multiplexer select signal (mux_sel_b3), and provide the first sae signal (sae_0) to the sense amplifier (SA: 320A4) in the first column (col_1) and to the sense amplifier (SA: 320C4) in the third column (col_3). The control logic 310D includes second logic gates (LG2, I2) that receive the sense amplifier enable (sae) signal, receive the fourth multiplexer select signal (mux_sel_b3), and provide the second sae signal (sae_1) to the sense amplifier (SA: 320B4) in the second column (col_2) and to the sense amplifier (SA: 320D4) in the fourth column (col_4). The control logic 310D includes third logic gates (LG3, I3) that receive the sense amplifier enable (sae) signal, receive the column select enable (cse) signal, and provide the column select signal (col_sel) to the first mux 324A4 and the second mux 324B4.

In some implementations, as shown in FIG. 3F, the bank mixing logic 312A may have a first multiplexer 328A that receives first four-bit data (OB_0A, OB_1A, OB_2A, OB_3A) from the first muxes 324A1, 324A2, 324A3, 324A4 of the banks (bank_0, bank_1, bank_2, bank_3), receives the bank mux select signal (bank_mux_sel), and provides first data (Out_1) of first selected data (Out_1 or Out_2) based on the bank_mux_sel signal. Also, the bank mixing logic 312A may have a second multiplexer 328B that receives second four-bit data (OB_0B, OB_1B, OB_2B, OB_3B) from the second muxes 324B1, 324B2, 324B3, 324B4 of the banks (bank_0, bank_1, bank_2, bank_3), receives the bank mux select signal (bank_mux_sel), and provides second data (Out_2) of first selected data (Out_1 or Out_2) based on the bank_mux_sel signal. The multiplexer logic 312A, 312B may include a third multiplexer 328C that receives the first data (Out_1) of first selected data (Out_1 or Out_2) from the first multiplexer 328A, receives the second data (Out_2) of first selected data (Out_1 or Out_2) from the second multiplexer 328B, receives the output multiplexer select signal (out_mux_sel), and provides the second selected data (Q_Output) as output data based on the out_mux_sel signal.

Further, as shown in FIG. 3F, the multiplexer circuitry (312A, 312B) may also include control logic 310E that has logic gates (e.g., AND gates: LG4, LG5) and buffer gates (e.g., inverters: I4, I5). The control logic 310E includes fourth logic gates (LG4, I4) that receive the sae signal, receive the cme1 signal, and provide the bank_mux_sel signal to the first mux 328A and the second mux 328B. Also, the control logic 310E may include fifth logic gates (LG5, I5) that receive the sae signal, receive the cme2 signal, and provide the out_mux_sel to the third mux 328C.

The memory circuitry 300 may be implemented as an integrated circuit (IC) in using various types of memory, such as, e.g., random access memory (RAM), including static RAM (SRAM), magneto-resistive RAM (MRAM), and/or any other type of similar memory. The memory circuitry 300 may be implemented as an IC with single or dual rail memory architecture. The memory circuitry 300 may also be integrated with computing circuitry and related components on a single chip. Also, the memory circuitry 300 may be implemented in various embedded systems for various electronic, mobile and Internet-of-things (IoT) applications, including low power sensor nodes.

As shown in FIGS. 3A-3F, the memory circuitry 300 includes multiple banks as multi-bank core array circuitry (wherein each bank has an array of memory cells, and each memory cell may be referred to as a bitcell). Each memory cell may be configured to store at least one data bit value (e.g., a data value related to a logical '0' or '1'). Each array of memory cells may include any number (N) of memory cells (or bitcells) arranged in various applicable configurations, such as, e.g., a two-dimensional (2D) memory array having any number (N) of columns (Ncolumns) and any number (N) of rows (Nrows) with memory cells arranged in a 2D grid pattern with associated indexing capabilities.

In various instances, each memory cell in each bank be implemented with RAM circuitry, or some other type of memory. For instance, each memory cell may include a multi-transistor static RAM (SRAM) cell, such as, e.g., 6T CMOS SRAM and/or various other types of complementary MOS (CMOS) SRAM cells, such as, e.g., 2T, 4T, 8T, or more transistors per bit. In other instances, each bitcell may include a multi-layer MRAM bitcell having free-layers and pinned layers. Also, the RAM core circuitry may operate at various source voltage levels (e.g., Vdd, Vss, etc.) with a voltage range that varies with applicable technology for specific ICs.

In some implementations, the flexible-bank=8 (multi-bank) circuit design shown in FIGS. 3A-3F supports column-redundancy for mux-8 architecture. For instance, each repetitive col-4 logic may have an internal sense amplifier (SA) for simplifying mux-4 and mux-8 timing and for reducing bitline (BL) load. In this instance, the mux-8 select signal (address-bit) may be factored into the sae signal, and instead of using the same sae signal for all of the col-4 logic blocks, two unique sense-amp enable signals (sae_0 and sae_1) are used, wherein each sae signal is used to select corresponding col-4 logic depending on the mux-8 select input. In some instances, a dedicated 2:1 mux is used to implement the mux-8 logic. Also, multi-bank selection may be achieved by the same single 4:1 mux, which may assist with selecting the needed mux-8 output from one of 4 banks.

Also, to implement column-redundancy, the original 2:1 mux may be used to select either the original column or the shifted redundant column.

Advantages may be achieved using this multiplexing technique. For instance, less dynamic power may be used because, instead of enabling multiple sense amplifiers, only one col-4 mux is enabled at a time, which may significantly reduce sense amplifier power (e.g., by half), and which translates to saving memory read power. Also, a simpler circuit design may be achieved, wherein the same margining scheme may be used for both of the mux-8 logic and also the mux-4 logic.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include memory circuitry having a single bank of memory cells arranged in multiple columns, and each column of the multiple columns may provide singe-bit data. The device may include multiplexer circuitry having multiplexer logic that receives the single-bit data from each column of the multiple columns and provides selected data as output data.

Described herein are various implementations of a device. The device may include memory circuitry having multiple banks of memory cells arranged in columns, and each bank of the multiple banks may provide multi-bit data for the columns. The device may include multiplexer circuitry having bank mixing logic and multiplexer logic. The bank mixing logic may receive the multi-bit data from each bank of the multiple banks and provide first selected data. The multiplexer logic may receive the first selected data from the bank mixing logic and provide second selected data as output data.

Described herein are various implementations of a device. The device may include memory circuitry having multiple banks of memory cells arranged in multiple columns, and each bank of the multiple banks may have first multiplexer logic that provides multi-bit data for the multiple columns. The device may include multiplexer circuitry having bank mixing logic and second multiplexer logic. The bank mixing logic may receive the multi-bit data from the first multiplexer logic in each bank of the multiple banks and provide first selected data to the second multiplexer logic. The second multiplexer logic may receive the first selected data from the bank mixing logic and provide second selected data as output data.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. A device, comprising:
   memory circuitry having a single bank of memory cells arranged in multiple columns, wherein each column of the multiple columns includes a sense amplifier that provides singe-bit data from each column; and
   multiplexer circuitry having multiplexer logic that receives the single-bit data from each sense amplifier of each column as multi-bit data and provides selected data as output data, wherein the multi-bit data received by the multiplexer logic is greater than two-bit data.

2. The device of claim 1, wherein each sense amplifier that provides the single-bit data for each column based on a split sense amplifier enable (split-sae) signal.

3. The device of claim 2, wherein the single bank includes control logic that enables each sense amplifier in each column to provide each single-bit data corresponding to each column of the multiple columns in the single bank.

4. The device of claim 1, wherein the single bank includes four-column logic that provides first four-bit data as the multi-bit data to the multiplexer logic, and wherein the multiplexer logic has a multiplexer that receives the multi-bit data from the four-column logic and provides the selected data as the output data.

5. A device, comprising:
   memory circuitry having a single bank of memory cells arranged in multiple columns, wherein each column of the multiple columns provides singe-bit data; and
   multiplexer circuitry having multiplexer logic that receives the single-bit data from each column of the multiple columns and provides selected data as output data,
   wherein the multiple columns of the single bank include a first column that provides first single-bit data, a second column that provides second single-bit data, a third column that provides third single-bit data, and a fourth column that provides fourth single-bit data.

6. The device of claim 5, wherein the multiplexer logic has a multiplexer that receives the first single-bit data, receives the second single-bit data, receives the third single-bit data, receives the fourth single-bit data, and provides the selected data as the output data.

7. The device of claim 1, wherein one or more columns of the multiple columns refer to one or more redundant columns having redundant memory cells.

8. A device, comprising:
   memory circuitry having multiple banks of memory cells arranged in columns, wherein each bank of the multiple banks provides multi-bit data for the columns in each bank, wherein each bank has sense amplifier circuitry with a sense amplifier for each column of the columns in each bank, and wherein single-bit data provided by each column collectively forms the multi-bit data provided by each bank; and
   multiplexer circuitry having bank mixing logic and multiplexer logic, wherein the bank mixing logic receives the multi-bit data from each bank of the multiple banks and provides first selected data, and wherein the multiplexer logic receives the first selected data from the bank mixing logic and provides second selected data as output data, and wherein each multi-bit data received by the bank mixing logic from each bank is greater than two-bit data.

9. The device of claim 8, wherein each sense amplifier for each column of the columns in each bank provides each single-bit data based on a split sense amplifier enable (split-sae) signal.

10. The device of claim 9, wherein each sense amplifier provides single-bit data for each column in each bank, and the multi-bit data provided by each bank includes multiple single-bit data corresponding to the columns in each bank of the multiple banks.

11. The device of claim 10, wherein each bank of the multiple banks includes control logic that enables each sense amplifier to provide each single-bit data corresponding to each column of the columns in each bank of the multiple banks.

12. The device of claim 8, wherein the multiple banks include a first bank that provides first multi-bit data and a second bank that provides second multi-bit data.

13. The device of claim 12, wherein the first bank has first four-column logic that provides first four-bit data as the multi-bit data, and wherein the second bank has second four-column logic that provides second four-bit data as the multi-bit data.

14. A device, comprising:
   memory circuitry having multiple banks of memory cells arranged in columns, wherein each bank of the multiple banks provides multi-bit data for the columns; and
   multiplexer circuitry having bank mixing logic and multiplexer logic, wherein:
      the bank mixing logic receives the multi-bit data from each bank of the multiple banks and provides first selected data,
      the multiplexer logic receives the first selected data from the bank mixing logic and provides second selected data as output data,
      the bank mixing logic has a first multiplexer that receives a part of the first four-bit data from the first four-column logic of the first bank, receives a part of the second four-bit data from the second four-column logic of the second bank, and provides first data of first selected data,
      the bank mixing logic has a second multiplexer that receives another part of the first four-bit data from the first four-column logic of the first bank, receives another part of the second four-bit data from the second four-column logic of the second bank, and provides second data of first selected data, and
      the multiplexer logic has a third multiplexer that receives the first data of first selected data from the first multiplexer, receives the second data of first selected data from the second multiplexer, and provides the second selected data as output data.

15. The device of claim 8, wherein one or more columns of the columns in each bank of the multiple banks refer to one or more redundant columns having redundant memory cells.

16. A device, comprising:
   memory circuitry having multiple banks of memory cells arranged in multiple columns, wherein each bank of the multiple banks has first multiplexer logic that provides multi-bit data for the multiple columns; and
   multiplexer circuitry having bank mixing logic and second multiplexer logic, wherein the bank mixing logic receives the multi-bit data from the first multiplexer logic in each bank of the multiple banks and provides first selected data to the second multiplexer logic, and wherein the second multiplexer logic receives the first selected data from the bank mixing logic and provides second selected data as output data.

17. The device of claim 16, wherein each bank of the multiple banks has sense amplifier circuitry with a sense amplifier for each column of the multiple columns in each bank based on a split sense amplifier enable (split-sae) signal.

18. The device of claim 17, wherein each sense amplifier provides single-bit data for each column, and the multi-bit data includes multiple single-bit data corresponding to the columns in each bank of the multiple banks.

19. The device of claim 18, wherein each bank of the multiple banks includes control logic that enables each sense amplifier to provide each single-bit data corresponding to each column of the columns in each bank of the multiple banks.

20. The device of claim 16, wherein one or more columns of the columns in each bank of the multiple banks refer to one or more redundant columns having redundant memory cells.

* * * * *